United States Patent [19]

Ikeda

[11] Patent Number: 5,495,213

[45] Date of Patent: Feb. 27, 1996

[54] LC NOISE FILTER

[76] Inventor: Takeshi Ikeda, 2-5-6-213, Sanno, Ohta-ku, Tokyo, Japan

[21] Appl. No.: 276,494

[22] Filed: Jul. 18, 1994

Related U.S. Application Data

[63] Continuation of Ser. No. 601,675, Oct. 23, 1990, abandoned.

[30] Foreign Application Priority Data

Oct. 26, 1989 [JP] Japan ................................ 1-279042

[51] Int. Cl.⁶ ............................ H03H 7/00; H01F 27/28
[52] U.S. Cl. ......................... 333/181; 336/69; 336/200; 336/223; 333/185
[58] Field of Search ........................... 336/69, 70, 200, 336/232, 223; 333/181, 185, 219, 156

[56] References Cited

U.S. PATENT DOCUMENTS

| 2,851,765 | 9/1958 | Hanlet . | |
| 2,943,966 | 7/1960 | Leno et al. | 336/200 |
| 3,210,703 | 10/1965 | Loekie | 336/69 |
| 3,609,600 | 9/1971 | Kassabgi | 333/156 |
| 4,694,283 | 9/1987 | Reeb | 333/219 |

FOREIGN PATENT DOCUMENTS

| 1604653 | 2/1972 | France . | |
| 2369694 | 5/1978 | France | 336/232 |
| 2260492 | 6/1974 | Germany | 336/200 |
| 55-156311 | 12/1980 | Japan . | |
| 57-162319 | 12/1982 | Japan . | |
| 60-33702 | 2/1985 | Japan | 333/185 |
| 63-7017 | 2/1988 | Japan . | |
| 62-234409 | 4/1988 | Japan . | |
| 2-45903 | 2/1990 | Japan | 336/200 |
| 8905034 | 6/1989 | WIPO . | |

OTHER PUBLICATIONS

IBM Technical Disclosure Bulletin, "Printed Circuit Coil," Styles, vol. 15 No. 1 Jun. 1992, p. 19.
Journal of Electronic Engineering, vol. 22, No. 222, Jun. 1985, "Tokin's EMC parts box, EPB series."

*Primary Examiner*—Thomas J. Kozma
*Attorney, Agent, or Firm*—Oliff & Berridge

[57] ABSTRACT

The present invention provides an LC noise filter consisting of a capacitance and an inductance, including a first insulation sheet having a plurality of portions folded alternately in the opposite directions and stacked one above another; a first conductor applied to the insulation sheet at one side and adapted to form a coil having a given number of turns when the folded portions of the insulation sheet are folded alternately in the opposite directions and stacked one above another; and a second conductor applied to the insulation sheet at the other side and located substantially opposite to the first conductor to form a capacitance therebetween, whereby the filter can eliminate incoming noises without creation of any undesirable phenomenon such as ringing or the like.

13 Claims, 17 Drawing Sheets

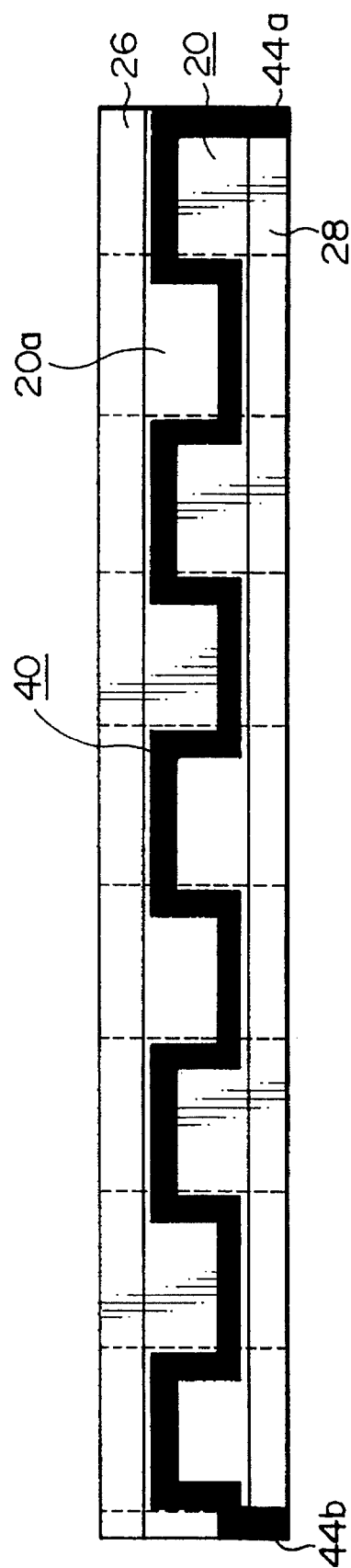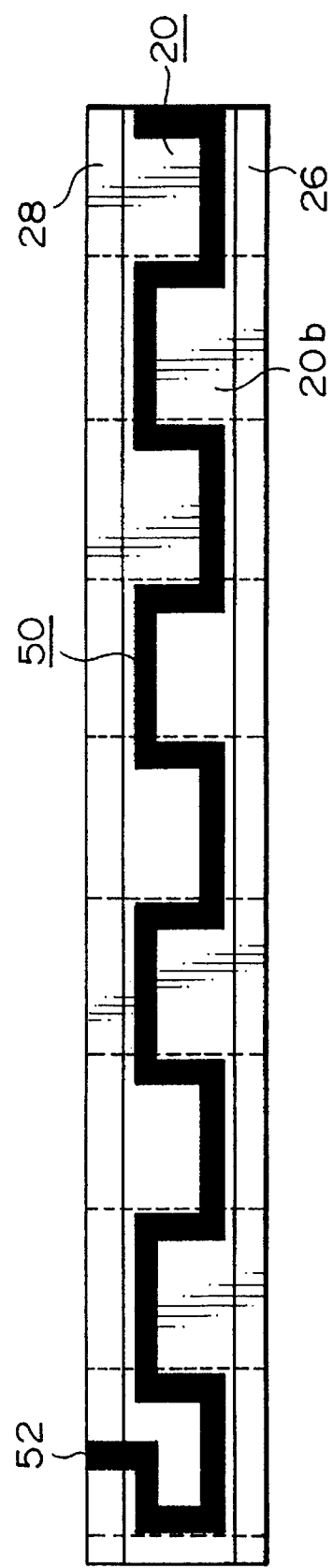

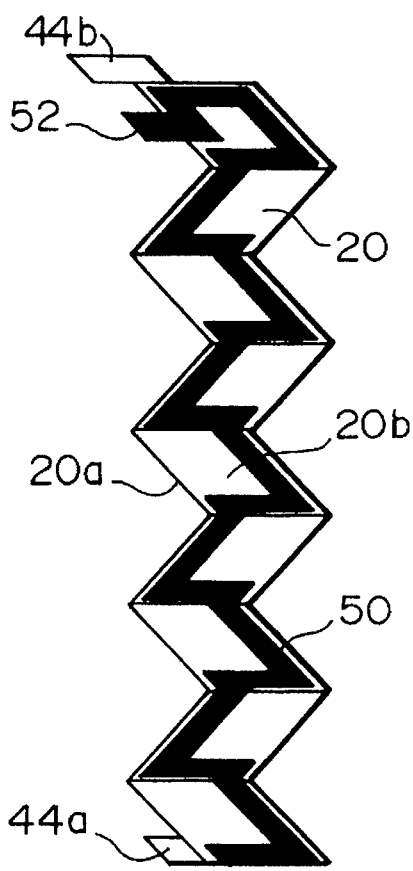
FIG. 12A
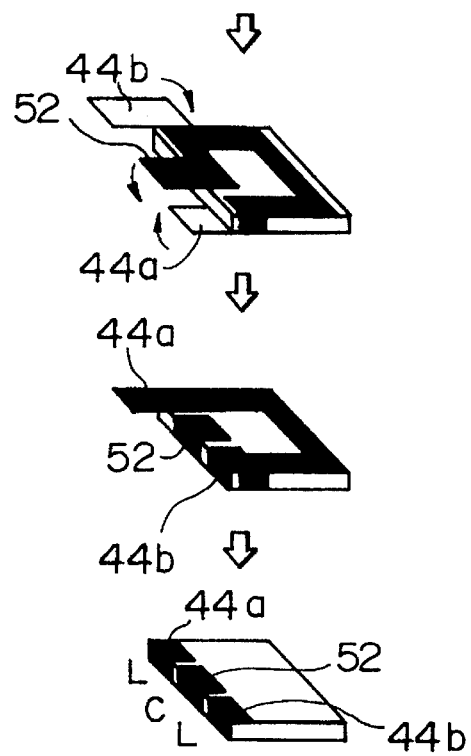
FIG. 12B
FIG. 12C
FIG. 12D

LC NOISE FILTER

This is a Continuation of application Ser. No. 07/601,675 filed Oct. 23, 1990, now abandoned.

BACKGROUND OF THE INVENTION

1. Field of the Invention

The present invention relates to an LC noise filter.

2. Description of the Prior Art

With recent development in electronic techniques, various types of electronic circuits are currently utilized in many fields of art. It is thus desirable that such electronic circuits can operate stably and reliably without being affected by any external disturbance.

Actually, however, such electronic circuits would be frequently disturbed directly or indirectly by external noise. This may frequently cause malfunction therein.

In particular, there are many electronic circuits which utilize a switching regulator as DC source. It is thus frequent that large noises having various frequency components are created on the source line of a switching regulator due to transient current on switching or due to variations of load from the switching operation of a digital integrated circuit (IC) used therein. These noises may adversely affect the other circuits in the same instrument through the source line or through radiation to create malfunction or reduction of S/N ratio. In addition, the noises may create malfunction in the other electronic instruments used adjacent to the noise-source instrument.

In order to remove the noises, generally, the electronic circuits include various types of noise filters. Particularly, there are many types of electronic high-performance instruments more recently used in the art. It is thus desired to develop a small-sized and high-performance noise filter which can reliably eliminate any possible noise.

One of noise filters developed for such a purpose is an LC noise filter shown in FIG. 22. As seen from FIG. 22A, this noise filter comprises a core 10 and a pair of windings 12 and 14 wound around the core 10. A capacitor 16 or 18 is connected in parallel between the windings 12 and 14 at the respective ends thereof.

In such a prior art noise filter, however, separately formed windings 12, 14 and capacitors 16, 18 are required. This leads to increase of the noise filter in size and manufacturing cost, in comparison with the recent desire of reduction in size and weight.

In addition, as seen from FIG. 22B, the prior art noise filter is of lumped constant type. Such a type of noise filter cannot reliably remove various types of noises entering the circuit, and particularly common-mode noises created in switching surge or normal-mode noises corresponding to ripple. If for the purpose of elimination of such noises, the capacity or inductance in the capacitor or coil is increased, there will then arise such a problem that a ringing is created.

SUMMARY OF THE INVENTION

It is therefore an object of the present invention to provide a small-sized LC noise filter which can reliably eliminate noise without creation of ringing or others.

To this end, the present invention provides an LC noise filter which comprises a first insulation sheet having a plurality of portions folded alternately in the opposite directions and stacked one above another, a first conductor provided on said insulation sheet at one side to form a coil having a given number of turns when the folded portions of said insulation sheet are folded alternately in the opposite directions and stacked one above another, and a second conductor provided on the other side of said insulation sheet and placed substantially opposite to the first conductor to form a capacitance therebetween.

The LC noise filter of the present invention functions as follows:

When the first insulation sheet is folded alternately in the opposite directions to form a stack, the first conductor on the one side of said insulation sheet forms a coil having a given number of turns, which functions as an inductive conductor.

At the same time, it is believed that the second conductor provided on the other side of the insulation sheet at a position opposed to the first conductor forms, with the first conductor, a distributed constant capacitance.

The LC noise filter according to the present invention thus functions as a distributed constant type filter which can have a good attenuation property through a relatively wide band range, in comparison with the prior art lumped constant type noise filters and which can eliminate various types of noises without ringing. Particularly, the LC noise filter of the present invention can more effectively eliminate various types of noises by effectively utilizing the L and C components in the distributed constant circuit.

Since the LC noise filter of the present invention is formed by stacking the folded portions one above another, the construction thereof can be simplified and reduced in size with lower manufacturing cost.

The LC noise filter of the present invention can be used as a common mode type LC noise filter by forming the first and second conductors into inductive conductors each having input and output terminals at the opposite ends.

The LC noise filter of the present invention can be also used as a normal mode type LC noise filter if the first conductor is formed into an inductive conductor having input and output terminals at the opposite ends and if the second conductor is formed into a capacitive inductor having a ground terminal.

In another aspect of the present invention, the LC noise filter may include a second insulation sheet, if necessary. The second insulation sheet is folded and stacked in a manner similar to that of the first insulation sheet. The second insulation sheet includes a third conductor formed therein at one side and positioned at a position substantially opposite to the second conductor through the folded portions of the second insulation sheet. The first and third conductors are formed into inductive conductors each having input and output terminals at the opposite ends while the second conductor is formed into a capacitive conductor having a grounding terminal. Thus, the LC noise filter of the present invention can be constructed to be of a common mode type.

BRIEF DESCRIPTION OF THE DRAWINGS

FIGS. 1 through 6 illustrate the first preferred embodiment of the present invention which is applied to a normal mode type three-terminal LC noise filter.

FIG. 1 illustrates a series of manufacturing steps.

FIG. 2 is an exploded and perspective view of insulation sheets onto which inductive and capacitive conductors are formed.

FIG. 3 illustrates patterns of the inductive and capacitive conductors.

FIG. 4 is a diagram of an equivalent circuit used in the LC noise filter in the first preferred embodiment.

FIG. 5 illustrates a pressing and forming procedure in which offset pins extending outwardly from a noise filter are worked to align with one another widthwise.

FIG. 6 is a graph showing the attenuation property of the LC noise filter according to the first preferred embodiment.

FIGS. 7 and 8 illustrate the second preferred embodiment of the present invention which is applied to a three-terminal type LC noise filter.

FIG. 7A shows the pattern of an inductive conductor formed on the front side of the insulation sheet; and FIG. 7B shows the pattern of a capacitive conductor formed on the back side of the insulation sheet.

FIG. 8 is a graph showing the attenuation property of the LC noise filter according to the second preferred embodiment.

FIGS. 9 and 10 illustrate the third preferred embodiment of the present invention.

FIG. 9 illustrates patterns of conductors formed on an insulation sheet at the opposite sides.

FIGS. 11 and 12 illustrate a modification of the third preferred embodiment.

FIGS. 11A and 11B illustrate patterns of conductors formed on an insulation sheet on the opposite sides: FIG. 11A shows the pattern of an inductive conductor formed on the front side of the insulation sheet.

FIGS. 12A through 12D illustrate a series of steps for assembling the LC noise filter according to the modification of the third embodiment.

FIG. 17 illustrates inductive and capacitive conductors formed on insulation sheets.

FIG. 18 is a schematic side view of a stack formed by folding said insulation sheets in a zigzag manner.

FIG. 19 is a diagram of an equivalent circuit used in the seventh preferred embodiment.

FIG. 22 illustrates an LC noise filter constructed according to the prior art.

DETAILED DESCRIPTION OF THE PREFERRED EMBODIMENTS

Figure 1A:
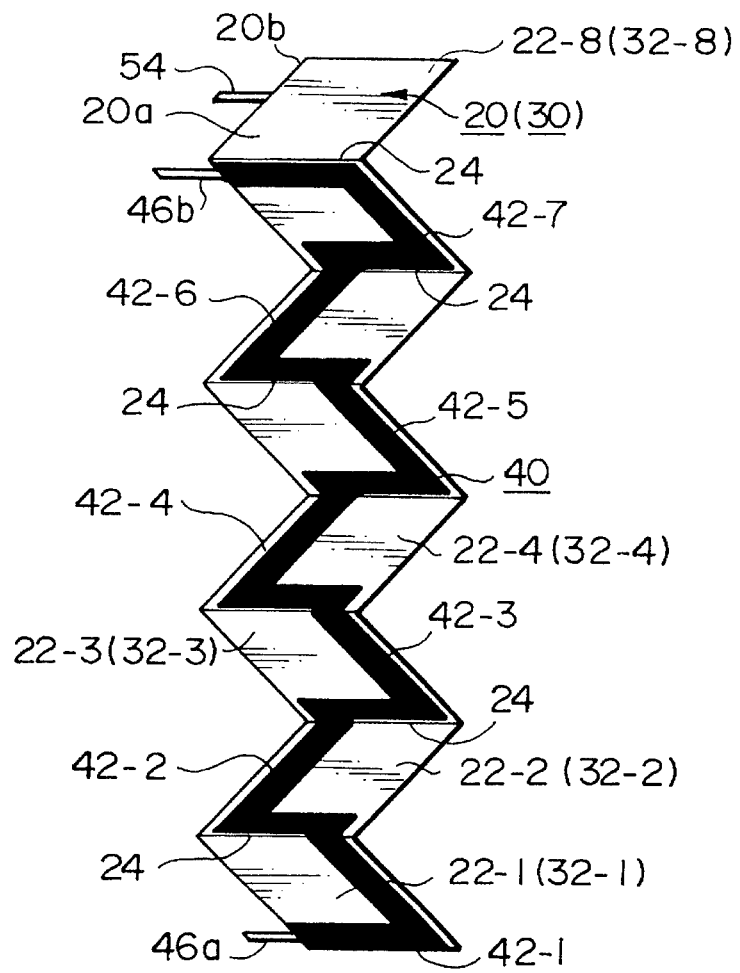
FIG. 1A shows an insulation sheet having a plurality of portions to be folded and stacked one above another about folding lines.

The present invention will now be described in more detail in connection with several preferred embodiments thereof illustrated in the drawings.

First Embodiment

Referring first to FIGS. 1 through 5, there is shown the first preferred embodiment of a normal mode type three-terminal LC noise filter constructed in accordance with the present invention.

Figure 2:
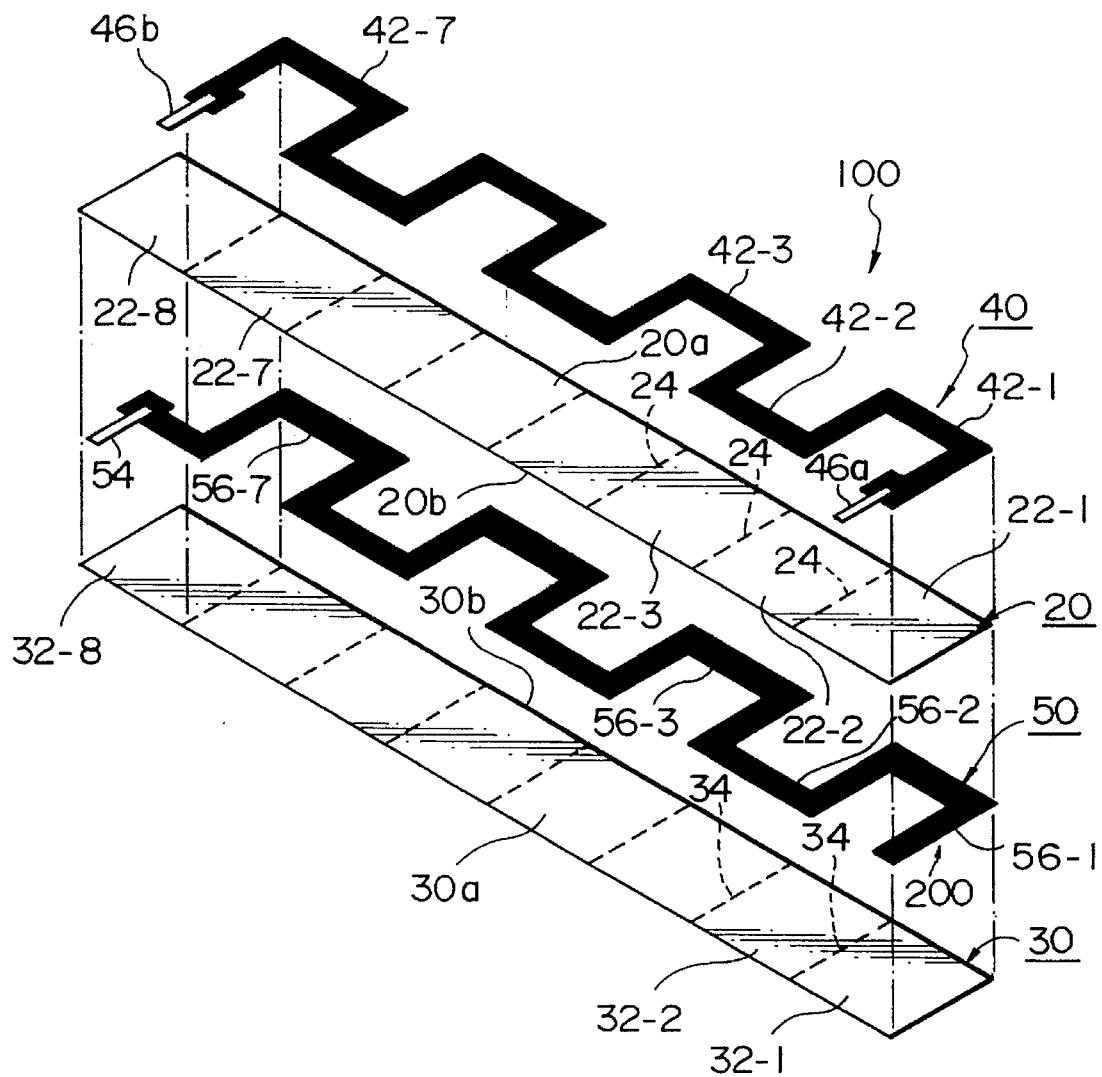

In order to produce this LC noise filter, a first insulation sheet 20 is first prepared as shown in FIG. 2. The first insulation sheet 20 is folded over about folding lines 24 to form a plurality of folded portions 22-1, 22-2, . . . 22-8 which is to be stacked. Each of the folding lines 24 may be previously perforated to facilitate the folding procedure. Although each of the folded portions is of a square plane configuration in this embodiment, it may be of any suitable plan configuration which can be stacked one above another on being folded over.

Figure 3A:
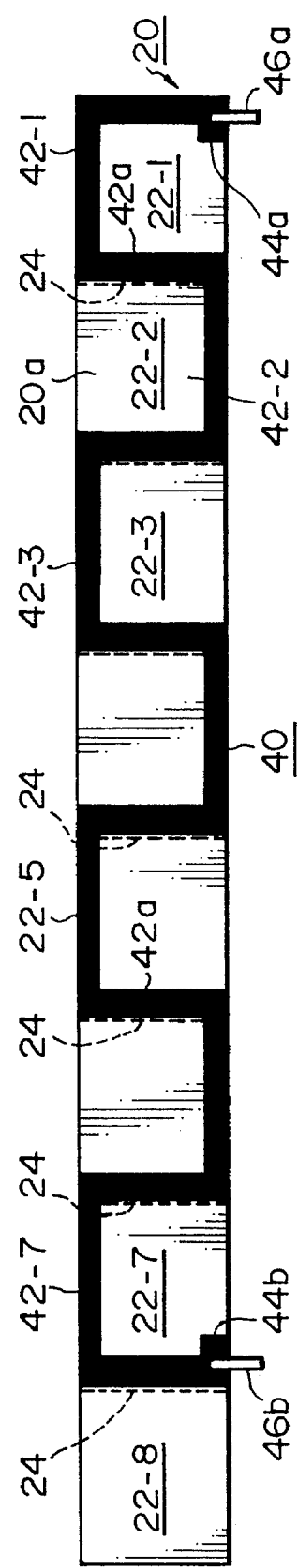
FIG. 3A is a plan view showing the insulation sheet as viewed from a direction of arrow 100 in FIG. 2.
Figure 3B:
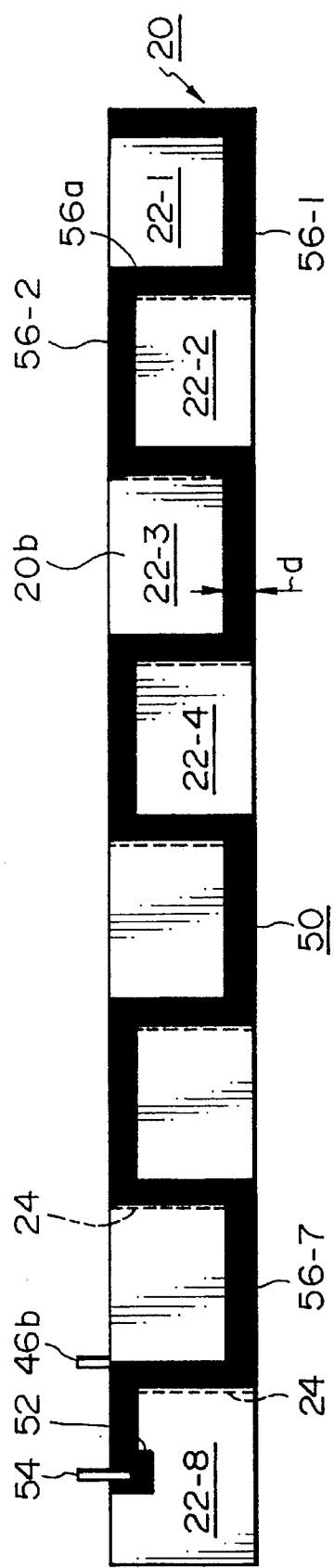
FIG. 3B is a plan view showing the insulation sheet as viewed from a direction of arrow 200 in FIG. 2.

The first insulation sheet 20 includes a first conductor 40 formed thereon at the front side 20a and having a pattern shown in FIG. 3A, and a second conductor 50 formed in the same sheet at the back side 20b and having a pattern shown in FIG. 3B.

The first conductor 40 comprises a plurality of inductive conductor sections 42-1, 42-2, . . . 42-7 each located on the corresponding one of the folded portions 22-1, 22-2 . . . 22-7 at the front side 20a of the insulation sheet 20. Each of the conductor sections 42-1, 42-2 . . . 42-7 is in the form of a partially opened ring. The conductor sections 42-1, 42-2, . . . 42-7 are disposed on the insulation sheet 20 with the openings thereof being directed alternately in the opposite directions. When the first insulation sheet 20 is formed to provide the folded portions folded alternately in the opposite directions and stacked one above another as shown in FIG. 1A, the conductor sections 42-1, 42-2, . . . 42-7 form a coil having a given number of turns (four turns in this embodiment).

The first conductor 40 has an input/output terminal 44a or 44b formed therein at each end. As shown in FIG. 3A, one of the input/output terminals 44a or 44b is formed in the first conductor 40 at the right and lower corner of the folded sheet portion 22-1 while the other input/output terminal 44b or 44a is formed at the left and lower corner of the folded sheet portion 22-7. Each of the input/output terminals 44a and 44b includes a pin 46a or 46b fixedly mounted thereon and used as an external connection conductor.

The second conductor 50 comprises a plurality of capacitive conductor sections 56-1, 56-2, . . . 56-7 each located on the corresponding one of the folded sheet sections 22-1, 22-2, . . . 22-7 at the back side 20b of the insulation sheet 20. Each of the capacitive conductor sections 56-1, 56-2, . . . 56-7 is of the same configuration as those of the inductive conductor sections 42-1, 42-2, . . . 42-7 and disposed opposite to the corresponding one of the inductive conductor sections 42-1, 42-2 . . . 42-7 to form a capacitance therebetween. When the second conductor 50 is viewed from the back side 20b of the first insulation sheet 20, it has such a pattern as shown in FIG. 3B. The second conductor 50 extends at one end into the central portion of the end folded portion 22-8 of the insulation sheet 20. At this end, the second conductor 50 has a grounding terminal 52 with a ground pin 54 fixedly mounted thereon and used as an external connection conductor.

In such an arrangement, the first and second conductors 40 and 50 may be formed on the first insulation sheet 20 by any suitable means such as printing, etching, plating and the like. For example, the conductors having such patterns as shown in FIGS. 3A and 3B may be adhesively applied to the first insulation sheet 20.

In this embodiment, parts 44a and 56a of the inductive and capacitive conductors 42 and 56 are formed along the folded sheet portions 22. Even if the first insulation sheet 20 is of a soft material, it can be folded over simply and reliably about the perforated folding portions 22. Further, even if each conductor is formed in a pattern spanned between adjacent folded sheet portions 22, the insulation sheet can be more easily folded by perforating both the conductor and insulator.

In this embodiment, each of the conductors 40 and 50 may be coated with an insulating layer. Alternatively, another or second insulation sheet 30 maybe used in place of the insulatively layered conductor 50. In such a case, the conductor 50 is adhesively sandwiched between the two insulation sheets 20 and 30. For simplicity, however, the following description will be made without the second insulation sheet 30.

Figure 1B:
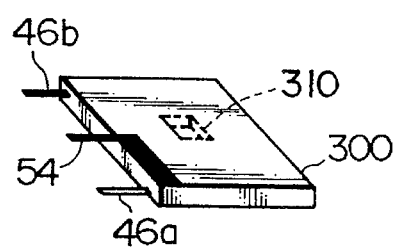
FIG. 1B is a perspective view showing the outline of a folded stack.

As shown in FIG. 1A, the insulation sheet 20 on which the conductors 40 and 50 are formed at the opposite sides is then folded over about folding lines 24 in a zigzag manner to form the folded portions 22-1, 22-2 . . . 22-8 which are to be stacked into a stack 300 shown in FIG. 1B. The partially opened conductor sections 42-1, 42-2 . . . 42-7 are stacked one above another to form a coil having a plurality of turns (four turns in this embodiment). Such a coil will function an inductor of inductance L1. At the same time, the conductor 50 is disposed opposed to the first conductor 40 through the insulation sheet 20 to form a capacitance C therebetween.

Figure 4:
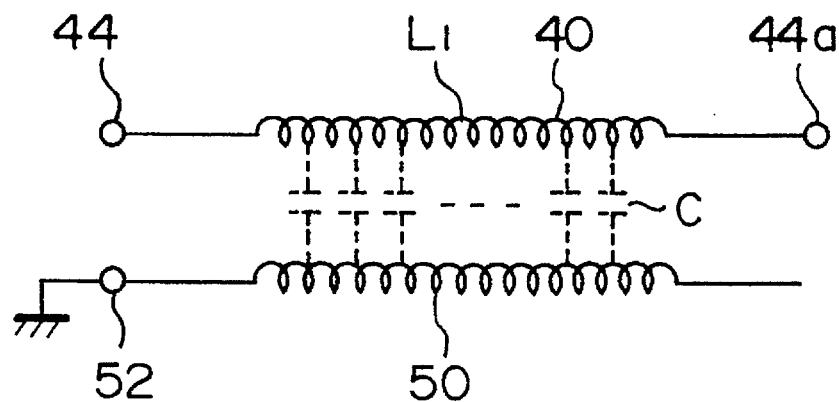

The resulting LC noise filter will function as a three-terminal type LC noise filter having an equivalent circuit as shown in FIG. 4.

As shown in FIG. 1B, the stack 300 includes pins 46a, 46b and 54 spaced equidistantly from each other. In such a manner, there will be properly positioned the input/output terminals 44a and 44b of the first conductor 40 and the grounding terminal 52 of the conductor 50.

Figure 1C:
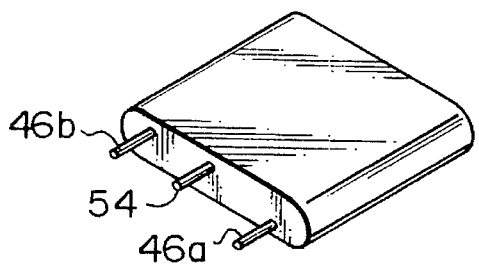
FIG. 1C is a perspective view showing a finished noise filter obtained from molding any suitable plastic material around the stack shown in FIG. 1B.

As shown in FIG. 1C, any suitable plastic material such as epoxy or the like is then molded around the stack 300 except the pins 46a, 46b and 54 to form a finished LC noise filter.

Figures 5A, 5B:
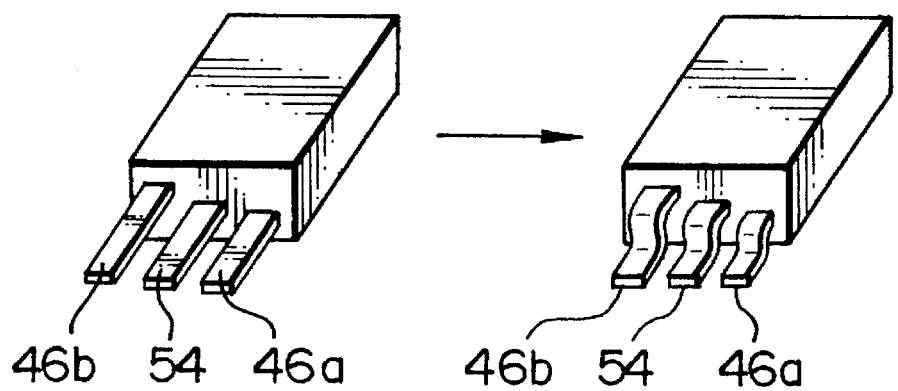

If the number of folded portions 22 is increased, the pins 46a, 46b and 54 may be non-aligned with one another widthwise as shown in FIG. 5A. This can be overcome by using the lead forming procedure to deform or bend the pins into in-line alignment.

As will be apparent from the foregoing, the present invention provides a flat LC noise filter by folding the first insulation sheet having the first and second conductors 40 and 50 formed therein at the opposite sides along the folding lines 24. Such a flat LC noise filter is smaller in size and weight than the prior art LC noise filters and extremely suitable for use in electronic circuits, the size and weight of which are desired to be as small as possible.

Furthermore, the LC noise filter of the present invention may have pins 46a, 46b and 54 which are aligned together to locate spaced equidistantly away from one another in line. This results in very easy mounting of the LC noise filter on a substrate. Since the spacing between the pins can be always maintained constant in accordance with the present invention, LC noise filters having their invariable attenuation property may be mass-produced with sufficient reduction of size.

The noise filter according to this embodiment functions a three-terminal type LC noise filter having an equivalent circuit shown in FIG. 4. It is particularly believed that the capacitance C between the first and second conductors 40 and 50 is formed in a distributed constant manner. Thus, the LC noise filter can perform a superior attenuation property which would not be obtained by the lumped constant type noise filters according to the prior art.

With further study by the inventors, it was found that the attenuation property of the noise filter was greatly influenced by the position of the second conductor 50 functioning as a grounding conductor relative to the first conductor 40 functioning as a powering inductor. In other words, the second conductor 50 may be positioned wholly or partially opposed to the first conductor 40, if necessary. In this embodiment, it has been found that a superior attenuation property is provided by disposing the second conductor 50 near the input and output terminals of the first conductor 40 in the electrical circuit.

It was further studied by the inventors in what position the grounding pin 54a of the second conductor 50 should be located. As a result, it has been found that the grounding pin 54 is preferably disposed at a position near one of the input/output pins 46a or 46b in the electrical circuit.

Figure 6:
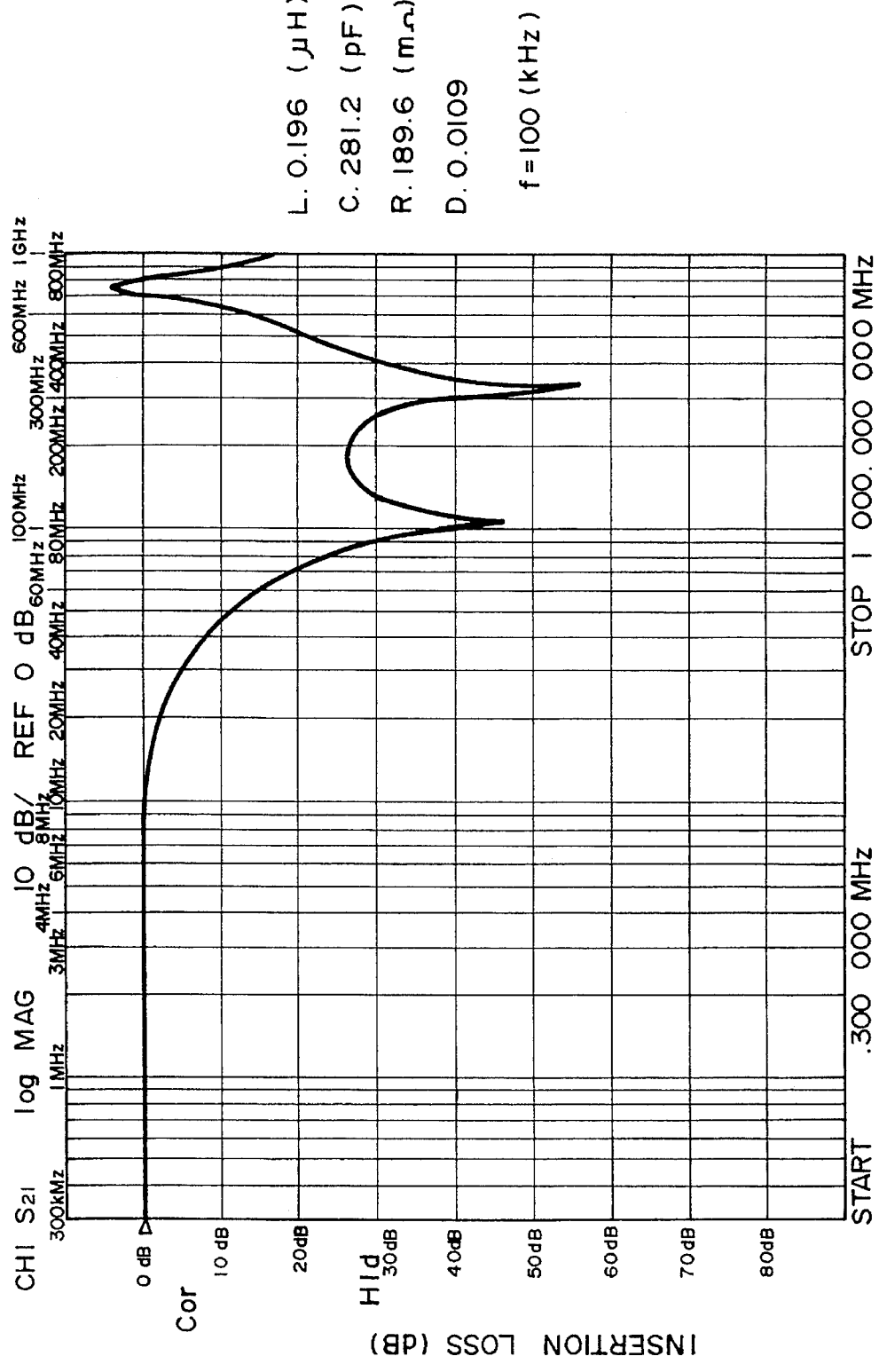

FIG. 6 shows the attenuation data of a LC noise filter in which the first conductor 40 is set to be L1=0.196 nH, R=189.6 mΩ while the second conductor 50 has its capacitance C=281.2 pF. It is understood from this graph that the LC noise filter according to this embodiment has a good attenuation property over a wide band range.

By increasing or decreasing the number of folded portions 22 and also the number of turns in the first conductor 40, the present invention can set the value of its inductance L1 at any desired level. Further, by increasing or decreasing the number of turns in the second conductor 50 relative to the first conductor 40 and also by variously changing the width of each conductor in the order in which that conductor is folded over, the value of capacitance C in the noise filter can be set at any desired level. Thus, the present invention can easily design and produce a three-terminal type LC noise filter having any desired values of L1 and C.

If it is desired to increase the value L1 in the first conductor 40, it is also effective to bond any suitable magnetic material on the surface of the conductor 40 or 50 by the use of any suitable bonding means. Alternatively, a powdered magnetic material may be incorporated into the insulation sheet. As shown by broken line in FIG. 1B, the stack 300 may include a bore 310 formed therein at the central portion thereof to insert a magnetic core while the entire surface of the stack 300 may be coated with a powdered magnetic material or the stack 300 itself may be housed within a container of magnetic material. In such a manner, a magnetic path may be formed around the stack 300 through the bore 310.

When it is wanted to increase the capacitance C in said LC noise filter, the width d of each of the conductors 40 and 50 as shown in FIG. 3A and 3B may be widened to any suitable size. In this connection, the conductor 50 may function as shielding means for the inductive conductor 40 to prevent a short-circuit between lines if the width d of the capacitive conductor is somewhat larger than that of the inductive conductor.

Second Embodiment

Figure 7A:
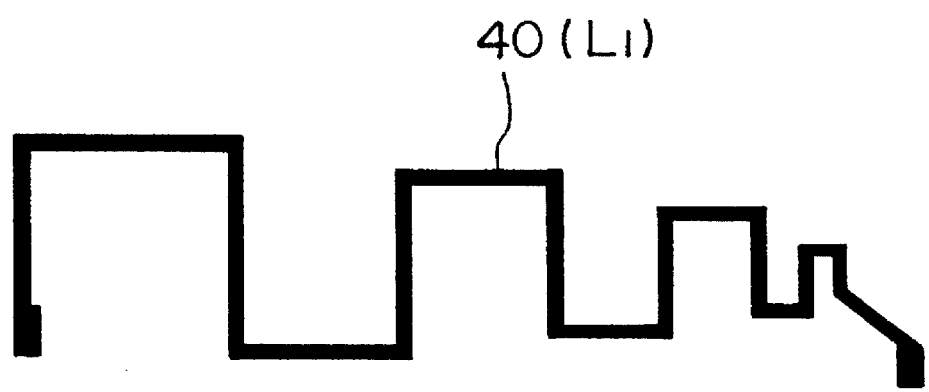
FIGS. 7A and 7B show patterns of conductors formed on an insulation sheet at the opposite sides.
Figure 7B:
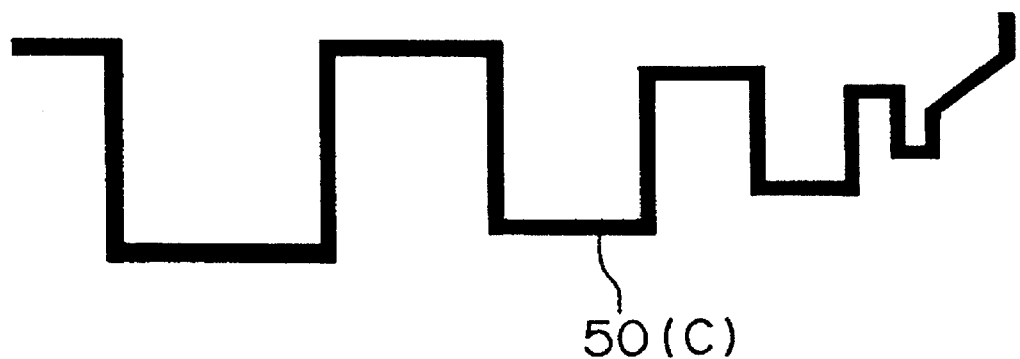

FIG. 7 shows the second preferred embodiment of the present invention.

Although the LC noise filter of the previous embodiment includes the first and second conductors 40 and 50 formed repeatedly in the same pattern, the second embodiment is characterized by that the pattern in the coil is gradually decreased in size toward one end.

When the first insulation sheet 20 is folded over in a zigzag manner, the conductors 40 and 50 will be wound to provide coils gradually decreased in diameter.

Figure 8:
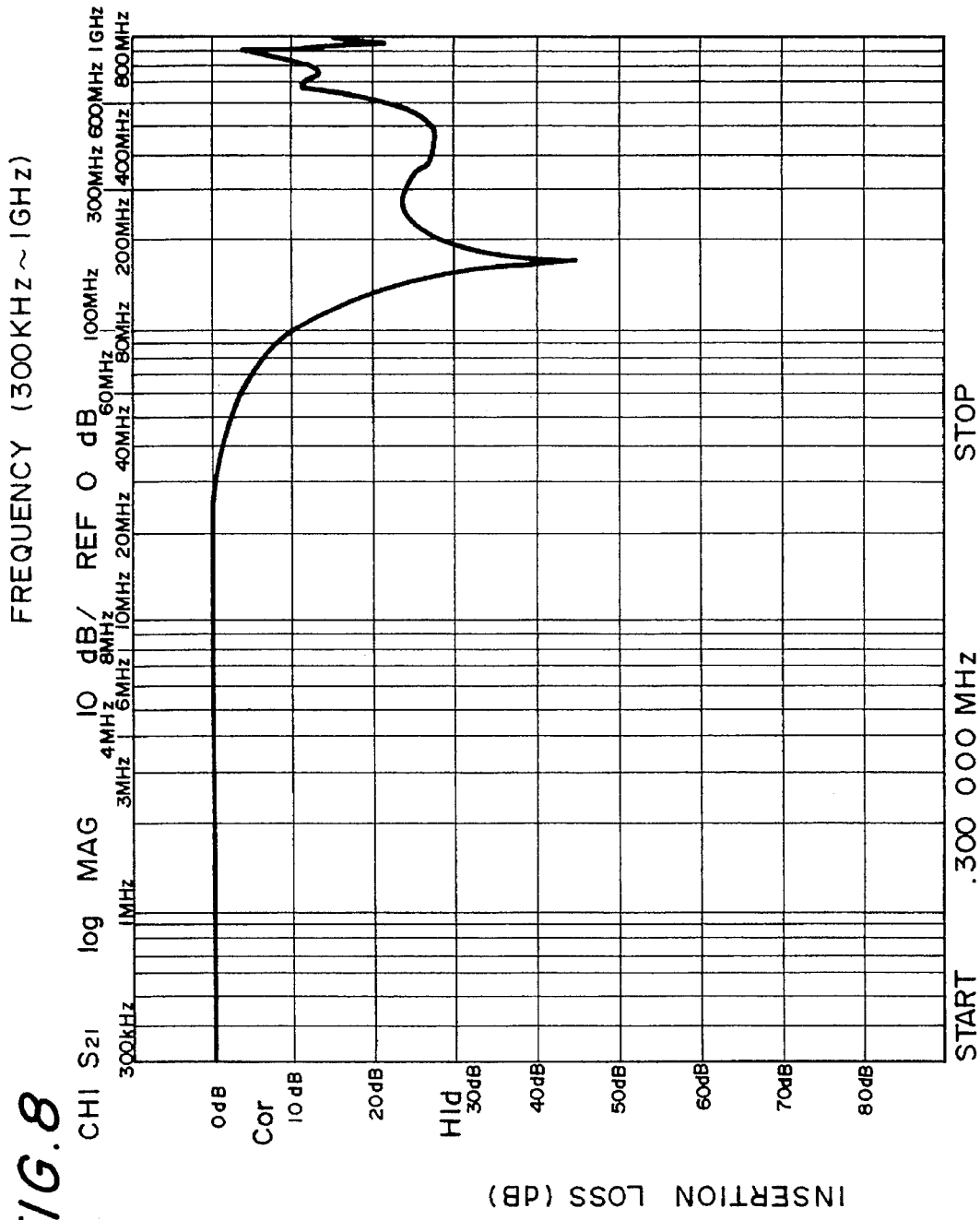

FIG. 8 shows the attenuation property of a three-terminal type LC noise filter constructed in accordance with the second embodiment of the present invention. Data shown herein is obtained in a case where the first conductor 40 is set to be L1=149.5 nH, R=311.5 mΩ while the conductor 50 is set to be C=105.8 pF. The second embodiment possesses a superior attenuation property over a wide band range, but different in pattern from that of the previous embodiment.

Third Embodiment

FIGS. 9 and 10 show the third preferred embodiment of the present invention, in which parts corresponding to those of the first and second embodiments are designated by similar reference numerals and will not be further described.

Figure 9A:
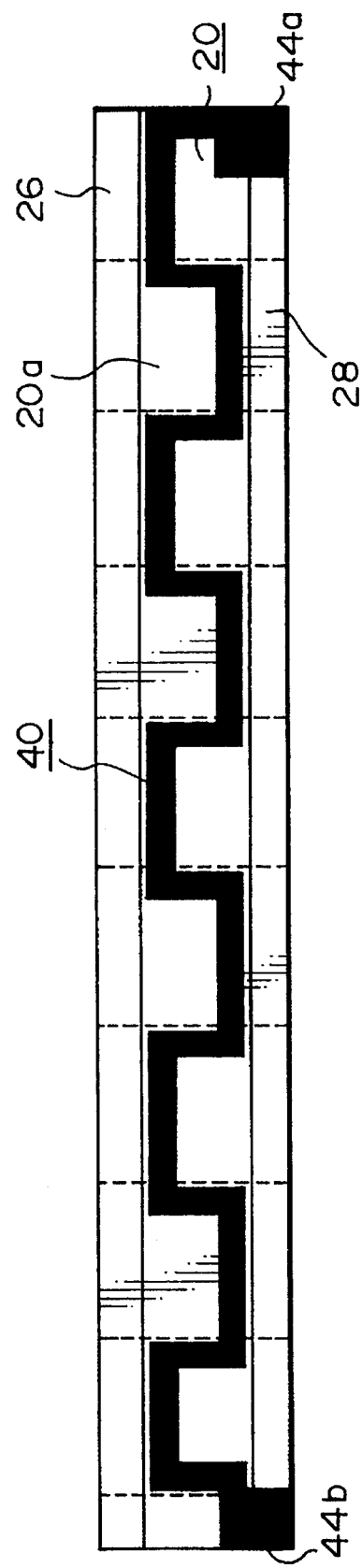
FIG. 9A shows the pattern of an inductive conductor formed on the front side of the insulation sheet.
Figure 9B:
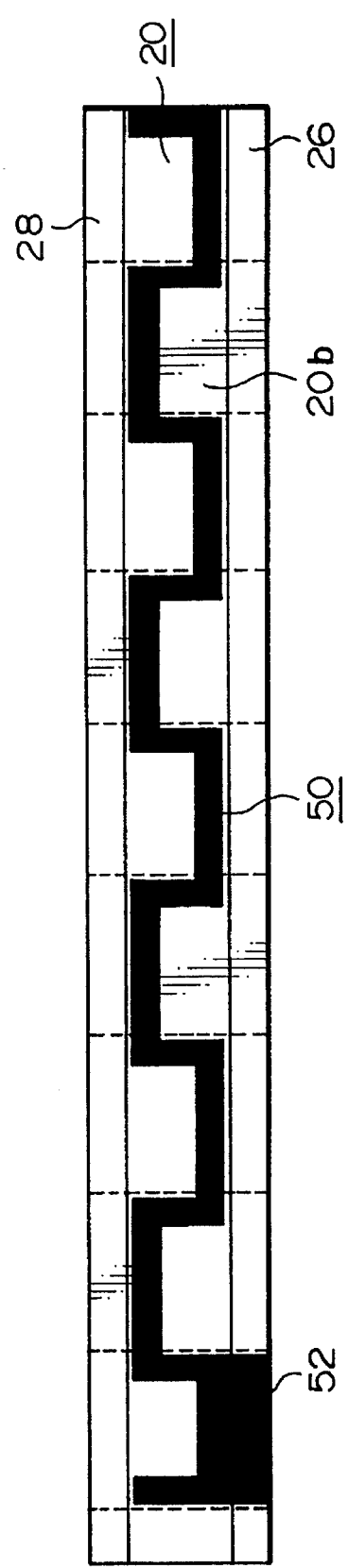
FIG. 9B shows the pattern of a capacitive conductor formed on the back side of the insulation sheet.

FIG. 9A shows the front side 20a of the first insulation sheet 20 while FIG. 9B shows the back side 20b of the same insulation sheet 20. The insulation sheet 20 includes extension areas 26 and 28 extending along the opposite side margins. As seen from FIG. 9A, the first conductor 40 includes input/output terminals 44a and 44b formed in one of the side extension areas 28 at the opposite ends of the insulation sheet 40, each of the terminals 44a and 44b having a relatively large width. As seen from FIG. 9B, the conductor 50 includes a grounding terminal 52 formed on the other extension area 26.

After formation of these terminals 44a, 44b and 52, the insulation sheet 20 is cut away at all the extension areas except that extension areas in which the terminals 44a, 44b and 54 are formed.

Figure 10A:
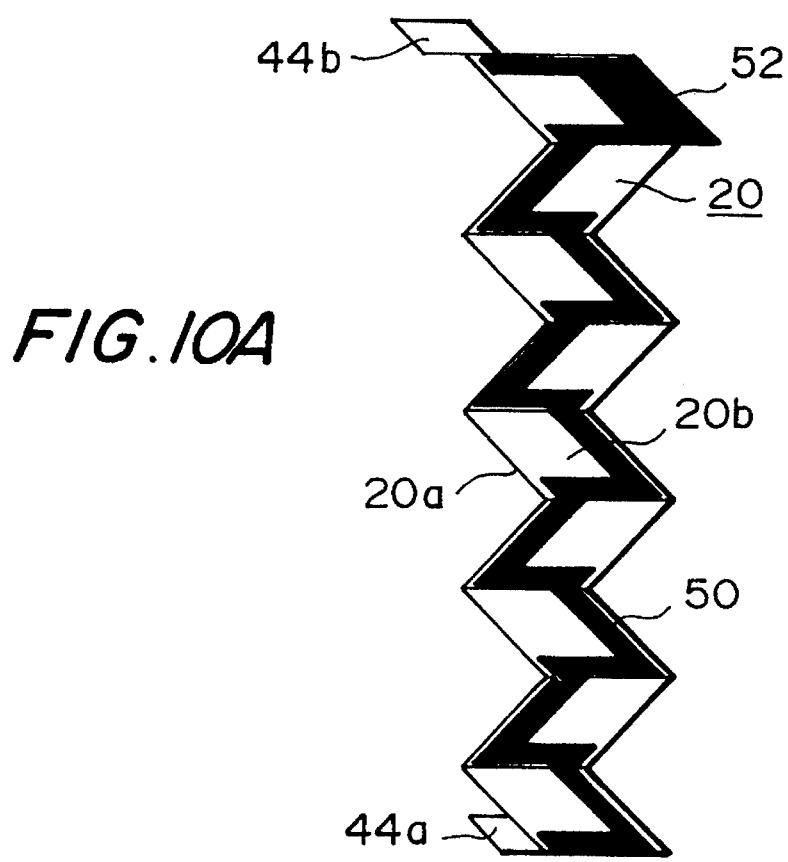
FIGS. 10A through 10D illustrate a series of assembling steps for producing the LC noise filter according to the third preferred embodiment.
Figure 10B:
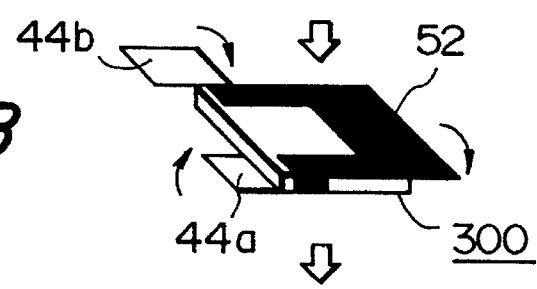

The resulting insulation sheet 20 is then folded in a manner similar to that of the previous embodiments as shown in FIG. 10A and subsequently stacked one above another to form a stack 300 as shown in FIG. 10B. At this time, it is preferred that the folded sheet portions 22 are bonded together by any suitable insulative bonding means such as insulative adhesive or the like.

Figure 10C:
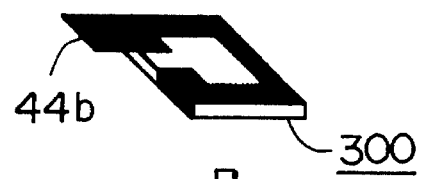
Figure 10D:
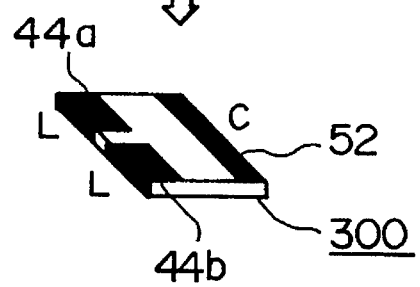

The wide terminals 44a, 44b and 54 extending outwardly from the stack 300 shown in FIG. 10B are subsequently folded over through steps of FIGS. 10C and 10D in the order shown by arrow. In such a manner, an LC noise filter can be formed as shown in FIG. 10D. At this time, the folded terminals 44a, 44b and 54 are preferably bonded onto the stack by any suitable insulative bonding means such as insulative adhesive or the like.

In accordance with the third embodiment, thus, a thin and flat LC noise filter of SMD (surface mount device) type can be provided and is very suitable for use in automatically assembling modern electronic circuits.

In the LC noise filter according to the third embodiment, the terminals 44a, 44b and 54 may be soldered directly to a circuit substrate or the like. If required, these terminals may be formed with connection pins.

Although the third embodiment of the present invention has been described as to such an arrangement in which the input/output terminals 44a and 44b of the first conductor 40 extend outwardly from the stack 300 in the direction opposite to that of the grounding terminal 52 in the second conductor 50, the present invention is not limited to such an arrangement and may be applied to another arrangement in which the input and output terminals 44a and 44b extend outwardly from the stack 300 in the same direction as that of the grounding terminal 52.

In the last-mentioned arrangement, the front and back sides 20a and 20b of the insulation sheet 20 will include first and second conductors 40 and 50 formed therein in such patterns as shown in FIGS. 11A and 11B. The resulting assembly may be folded to form a stack 300 in the order shown sequentially in FIGS. 12A through 12D.

Fourth Embodiment

Figure 13A:
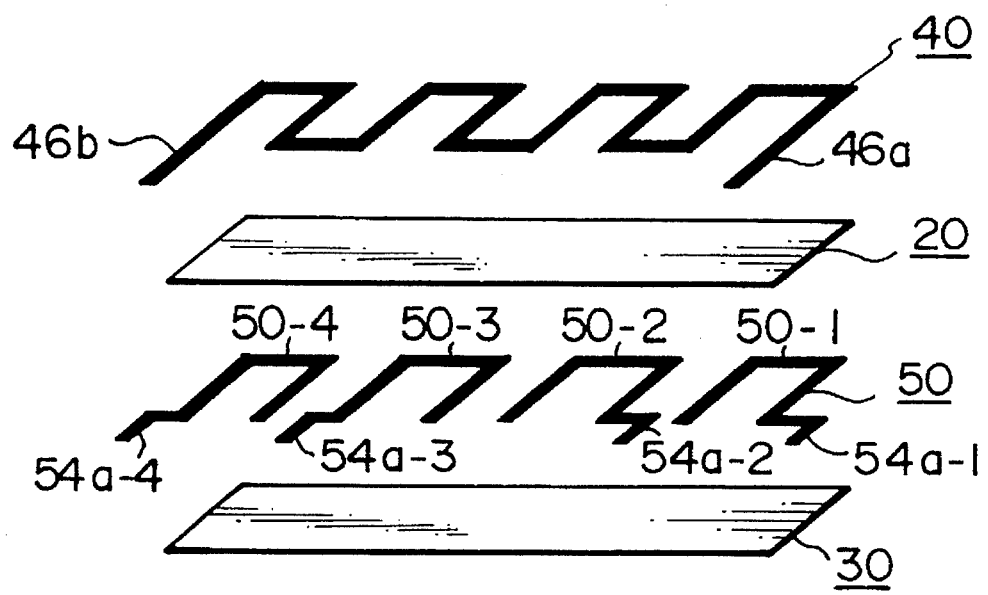
FIGS. 13A and 13B illustrate the fourth preferred embodiment of the present invention.

FIG. 13 shows the fourth preferred embodiment of the present invention, in which parts corresponding to those of the previous embodiments are denoted by similar reference numerals and will not further be described.

An LC noise filter constructed in accordance with the fourth embodiment is of a normal mode type as in the previous embodiment.

The fourth embodiment is characterized by that the second conductor 50 functioning as a capacitive conductor is divided into a plurality of grounding conductor sections 50-1, 50-2, 50-3 and 50-4, each of which is grounded. Each of the grounding conductor sections 50-1, 50-2, 50-3 and 50-4 has a terminal on which a grounding pin 54a-1, 54a-2, 54a-3 or 54a-4 is fixedly mounted as in the first embodiment.

Figure 13B:
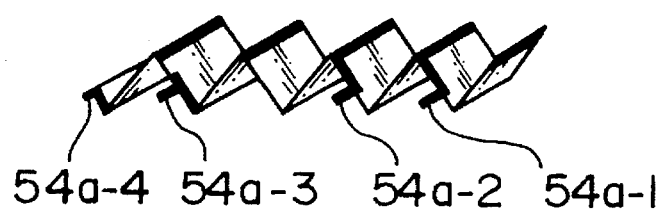
Figure 13C:
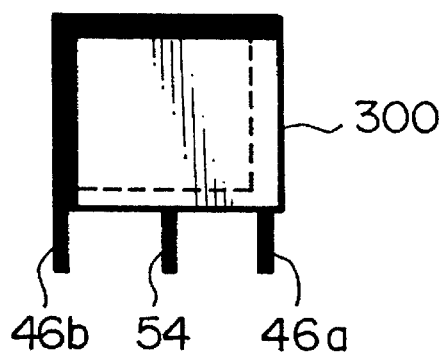

When insulation sheets 20 and 30 in which the first and second conductors 40 and 50 are respectively formed are folded and stacked to form a stack as shown in FIGS. 13B and 13C, the grounding pins 54a-1, 54a-2, 54a-3 and 54a-4 are arranged such that they will be brought together into one grounding pin 54.

In the resulting LC noise filter, each of the grounding conductor sections 50-1, 50-2 . . . 50-4 has a small self-inductance L. Therefore, the distributed constant capacitance formed between the first and second conductors 40 and 50 can be used directly as a capacitance in the LC noise filter.

With further study by the inventors, it has been found that the attenuation property of the noise filter is highly influenced by the position of the grounding conductor sections 50-1, 50-2, . . . 50-4 relative to the first conductor 40 functioning as an inductor. It has been also found that a superior attenuation property can be obtained if the divided grounding conductor sections 50-1 and 50-4 are arranged respectively near the input/output terminals of the first conductor 40 in the electrical circuit.

The inventors further studied the position of the grounding pins 54a-1, 54a-2, . . . 54a-4 in the divided grounding conductor sections 50-1, 50-2 . . . 50-4. As a result, it has been found that it is preferred that the grounding conductor sections 50-1 and 50-2 positioned near one of the input/output pins 46a in the electrical circuit have their grounding pins 54a-1 and 54a-2 positioned near that input/output pin 46a in the electrical circuit while the other grounding conductor sections 50-3 and 50-4 has their grounding pins 54a-3 and 54a-4 positioned near the other input/output pin 46b in the electrical circuit.

Thus, the LC noise filter of the fourth embodiment can function as a normal mode type filter having a good attenuation property.

Fifth Embodiment

Figure 14:
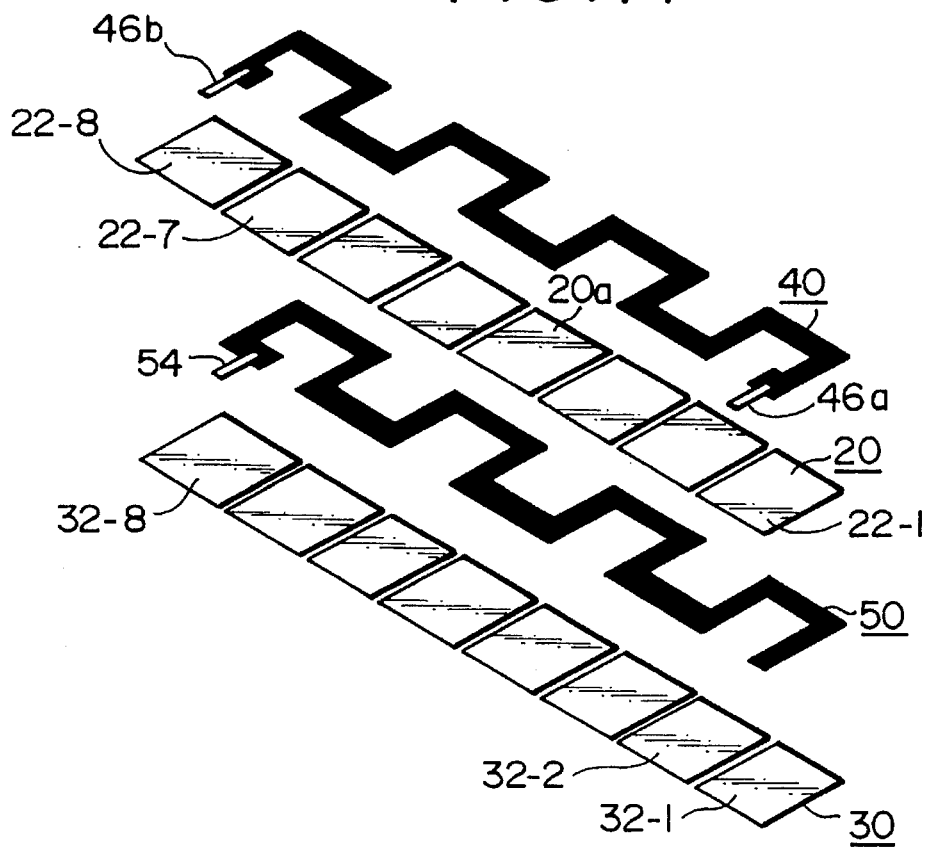
FIG. 14 illustrates the fifth preferred embodiment of the present invention.

FIG. 14 shows the fifth embodiment of the present invention.

In the previously described embodiments, the LC noise filter uses the first insulation sheet 20 or both the first and second insulation sheets 20 and 30, each of which is in the form of a single continuous sheet. With only the first insulation sheet 20, for example, a single continuous sheet is folded sequentially along perforated folding lines to provide a plurality of folded portions 20-1, 20-2, . . . 20-8.

On the contrary, the fifth embodiment is characterized by that it utilizes a plurality of separate insulation sheet portions corresponding to the folded portions 22-1, 22-2 . . . 22-8, as shown in FIG. 14.

In other words, the fifth embodiment utilizes first and second conductors 40 and 50 stamped from a body of conductive material with desired patterns, respectively. The sheet portions 22-1, 22-2 . . . 22-8 defining the first insulation sheet 20 are fixedly applied to the first conductor 40 while the sheet portions 32-1, 32-2, . . . 32-8 defining the second insulation sheet 30 are fixedly applied to the second conductor 50.

Thus, the sheet or folded portions 22-1, 22-2, . . . 22-8 defining the first insulation sheet 20 can be connected together by the first conductor 40 while the sheet or folded portions 32-1, 32-2 . . . 32-8 defining the second insulation sheet 30 can be connected together by the second conductor 50.

The resulting first and second insulation sheets 20 and 30 are then folded alternately in the opposite directions in the zigzag manner to form a stack, as in the first embodiment. Thus, an LC noise filter similar to that of the first embodiment can be formed.

In the fifth embodiment, it is preferred that the surfaces of the first and second conductors 40 and 50 are coated with insulating films such that the first and second conductors 40 and 50 will not be short-circuited at a gap between each adjacent insulative sheet or folded portions in the first insulation sheet 20.

Sixth Embodiment

Figure 15:
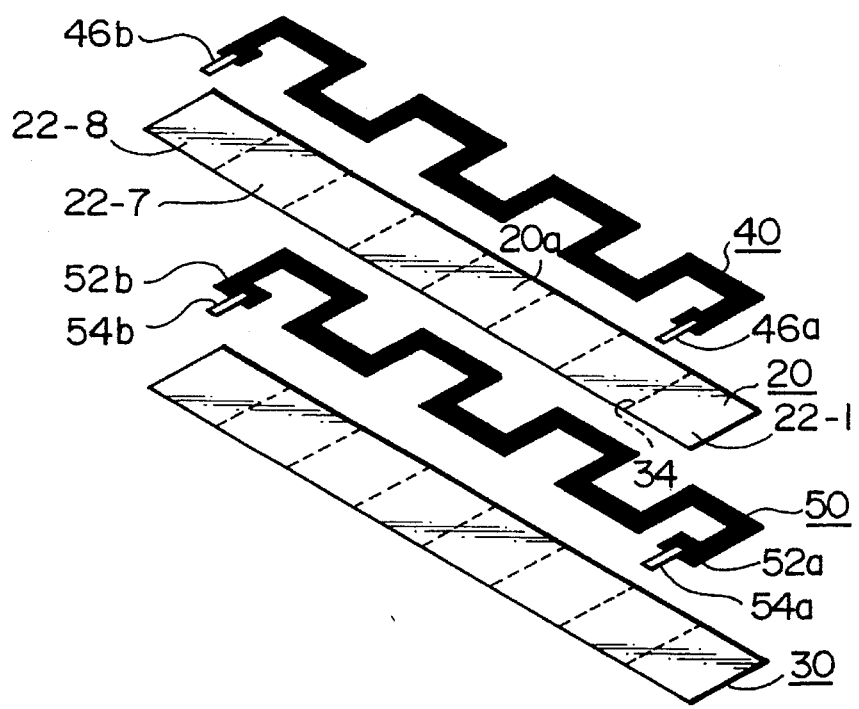
FIGS. 15 and 16 illustrate the sixth preferred embodiment of the present invention.
Figure 16:
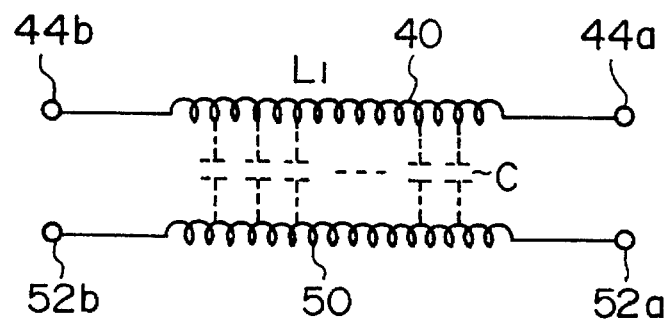

FIGS. 15 and 16 show the sixth preferred embodiment of the present invention.

Although the previously described embodiments provide normal mode type noise filters, the sixth embodiment is characterized by that it provides a common mode type LC noise filter.

More particularly, the LC noise filter of the sixth embodiment includes input/output terminals 52a and 52b formed in the second conductor 50 at the opposite ends in addition to the input/output terminals formed in the first conductor 40 at the opposite ends, as shown in FIG. 15. Each of these input/output terminals 52a and 52b is also formed with an input/output pin 54a or 54b.

FIG. 16 shows an equivalent circuit usable in the LC noise filter according to the sixth embodiment. As seen from FIG. 16, the first and second conductors 40 and 50 function as inductive conductors L1 and L2 which form a distributed constant capacitance C therebetween.

Thus, the LC noise filter constructed in accordance with the sixth embodiment can function as a common mode type four-terminal LC noise filter having a good attenuation property.

Seventh Embodiment

Figure 17:
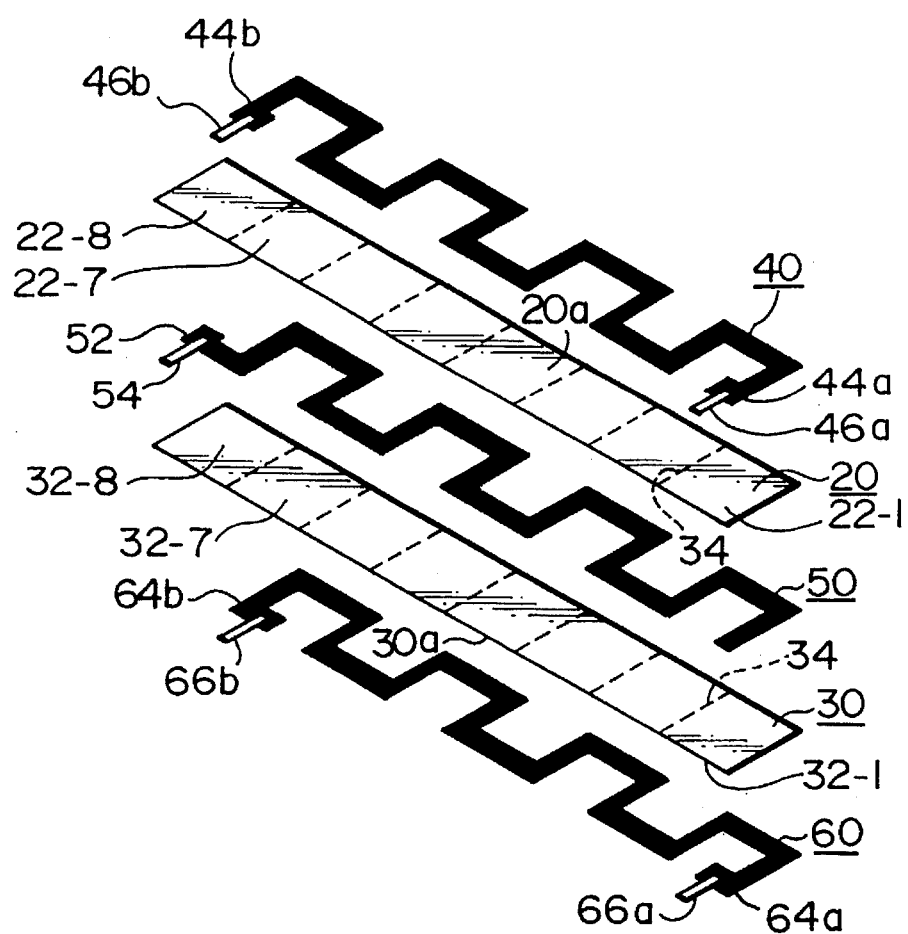
FIGS. 17 through 19 illustrate the seventh preferred embodiment of the present invention.
Figure 18:
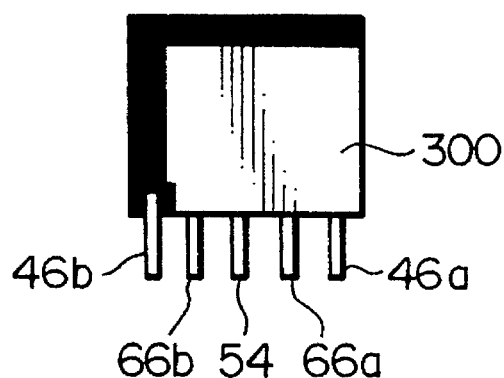
Figure 19:
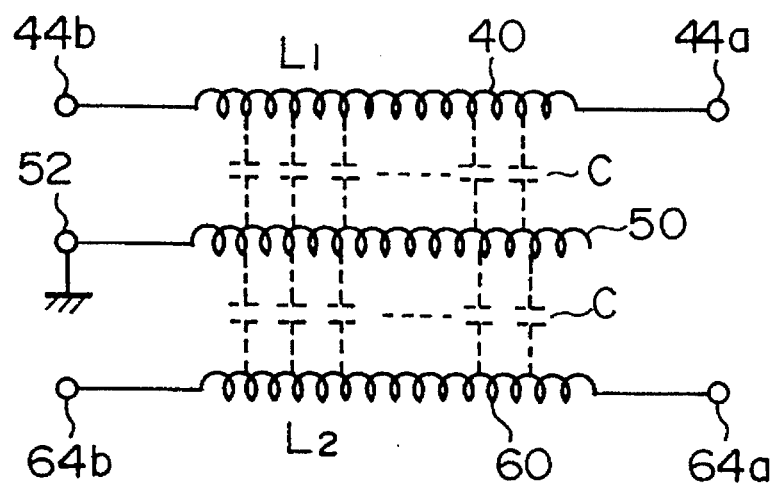
Figure 20:
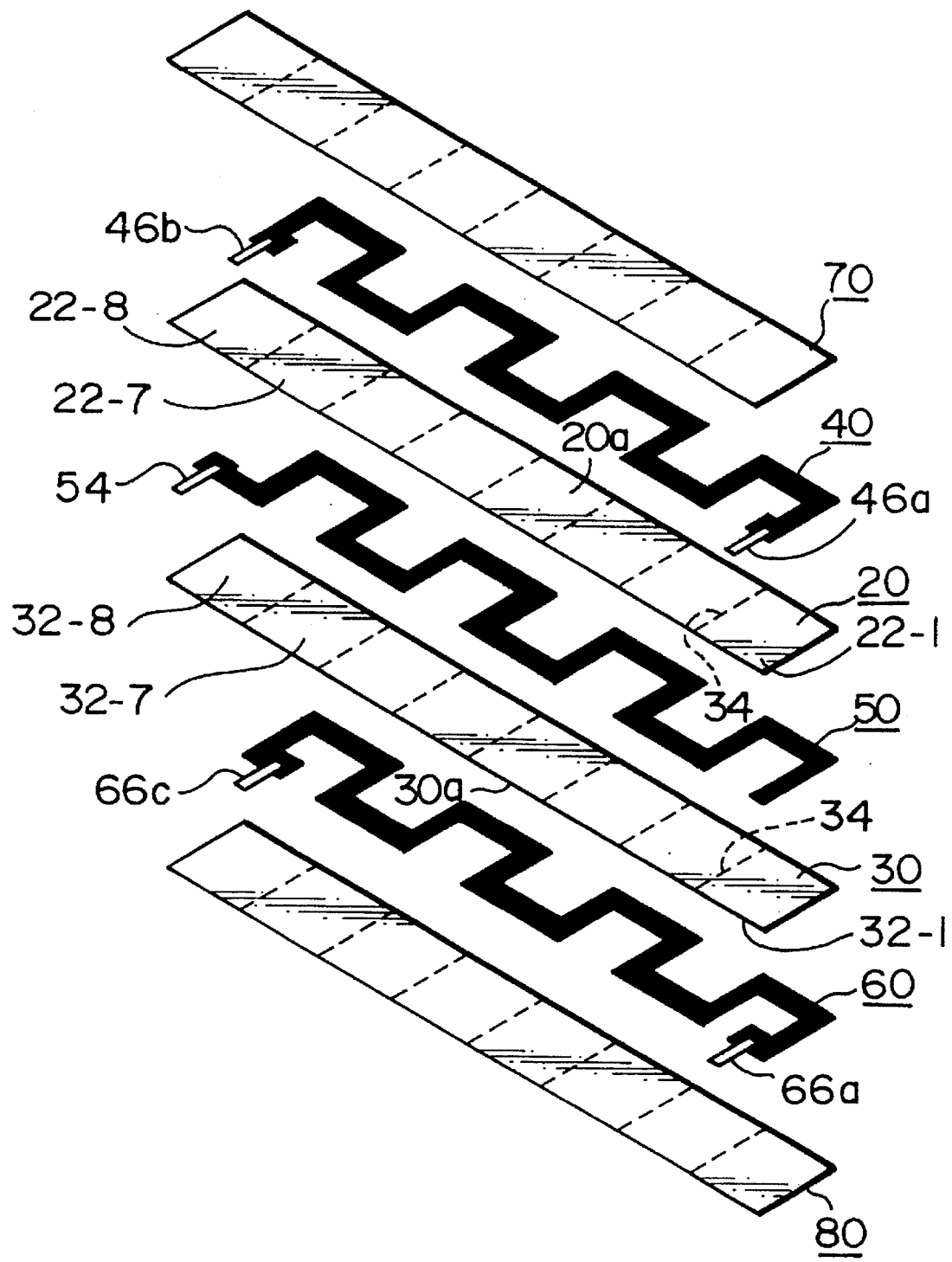
FIGS. 20 and 21 illustrate the other embodiments of the present invention.

FIGS. 17 through 19 show the seventh preferred embodiment of the present invention, in which parts corresponding to those of the first through fifth embodiments previously described are designated by similar reference numerals and will not further be described herein.

The LC noise filters of the previously described embodiments are of a common mode type filter, as in the sixth embodiment.

As shown in FIG. 17, an LC noise filter constructed according to the seventh embodiment utilizes first and second insulation sheets 20 and 30 which have the same construction. As in the previous embodiments, a first conductor 40 is formed on the front side 20a of the first insulation sheet 20. On the Other hand, the front side 30a of the second insulation sheet 30 is coated with a third conductor 60 having the same pattern as that of the first conductor 40.

A second conductor 50 functioning as a capacitive conductor is sandwiched and bonded between the insulation sheets 20 and 30.

A sheet assembly of the first and second insulation sheets 20 and 30 is then folded over in a zigzag manner as in the previously described embodiments. Thus, a stack 300 as shown in FIG. 18 can be formed. At this time, it is preferred that the conductors 40, 60 and 50 include terminals 44a, 44b, 64a, 64b and 52 so formed that input/output pins 46a, 66a, 54, 46b and 66b are arranged equidistantly and in line. Any suitable plastic material such as epoxy resin is molded around the stack 300.

FIG. 19 shows an equivalent circuit usable in the common mode type LC noise filter thus formed. As seen from this figure, the first and third conductors 40 and 60 function respectively as inductive conductors L1 and L2 with each forming a distributed constant capacitance C together with the second conductor 50.

In such a manner, the seventh embodiment provides a common mode type LC noise filter having a good attenuation property.

Other Embodiments

The present invention is not limited to the previous embodiments and may be applied in various modifications other than the previous embodiments.

Although the present invention has been described as to several embodiments in which the respective conductors functioning as inductive conductors are coated with insulation layers, the present invention is not limited to such an arrangement and may be applied to another arrangement in which insulation sheets 70 and 80 are used each to cover the respective one of the insulation sheets 20 and 30 with the inductive conductor 40 or 60 being sandwiched therebetween. In such a case, it is preferred that all the insulation sheets 70, 80, 20 and 30 are identical in construction.

Figure 21:
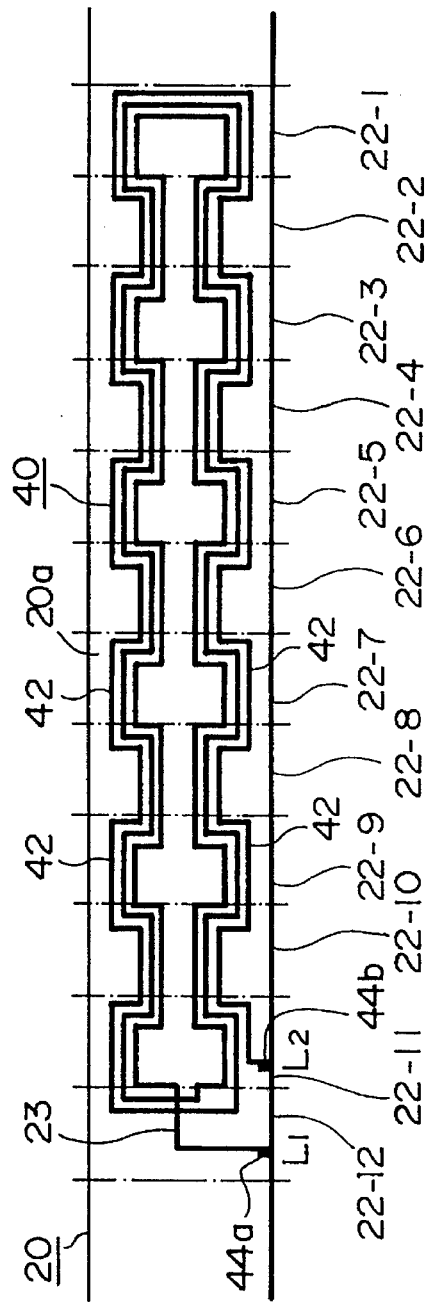
Figure 22B:
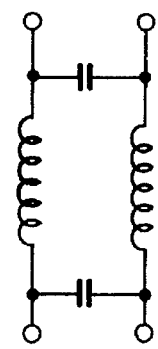
FIG. 22B is a diagram of an equivalent circuit used in the prior art LC noise filter.
Figure 22A:
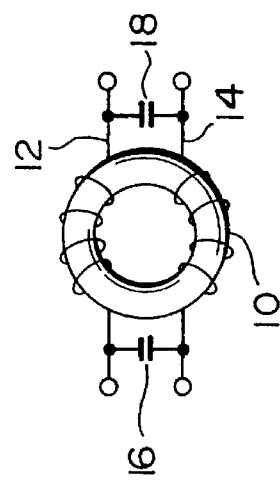
FIG. 22A shows the concrete structure of the prior art LC noise filter.

Furthermore, the present invention may provide an LC noise filter which utilizes conductors formed in such a pattern as shown in FIG. 21.

More particularly, such a pattern includes a plurality of inductive conductor sections 22 which are provided each in the form of a partially opened ring located in each of the folded portions 20 and which are arranged in the upper half of the first insulation sheet 20 with all the openings of the rings directed in the same direction. This pattern also includes another plurality of inductive conductor sections 22 which are identical in construction with, but different in orientation from that of the first-mentioned conductor sections and which are arranged in the lower half of the same insulation sheet 20 with all the openings of the rings directed in the opposite direction.

The first insulation sheet 20 thus formed is then folded in a zigzag manner as in the previous embodiments. Thus, there can be obtained an LC noise filter having the increased number of turns in the first conductor 40 and the increased inductance L1.

Since the inductive conductor 40 is enclosed at one end by the conductor sections 22 in the above arrangement, it is required that a jumper line 23 connects between said one end of the inductive conductor 40 and the input/output terminal 44.

By forming the first and second conductors (only the first one shown) with the pattern shown in FIG. 21, the resulting LC noise filter can have relatively large values L and C even if the number of folded portions 22 in the insulation sheet 20 is decreased.

If the insulation sheets are made of any electromagnetic wave absorbing and heat emitting material, the performance of the LC noise filter can be further increased in the high-frequency band range.

As will be apparent from the foregoing, the present invention provides a novel construction in which a first conductor is formed on an insulation sheet at one side while a second conductor is formed on the same insulation sheet in a position opposite to the first conductor at the other side. The insulation sheet is then folded alternately in the opposite directions in a zigzag manner with the folded sheet portions being stacked one above another. As a result, there will be formed an LC noise filter in which the first conductor functions as a coil having the desired number of turns and in which a capacitance is formed between the first and second conductors. This LC noise filter can be of such a type that can be small-sized and produced inexpensively and that can reliably eliminate any incoming noise without creation of ringing.

In accordance with the present invention, particularly, it is believed that an electrostatic capacity is formed in a distributed constant manner between the first and second conductors. Thus, the present invention can provide an LC noise filter having a superior attenuation property which can reliably attenuate and eliminate various incoming noises, different from the conventional lumped constant type noise filters.

I claim:

1. An LC noise filter comprising:
   an insulation sheet having a plurality of portions folded alternately in opposite directions and stacked one above another;
   an inductive conductor provided on said insulation sheet at a first side to form a coil having a given number of turns when said folded portions are folded alternately in the opposite directions and stacked one above another, said inductive conductor having a predetermined width; and
   a capacitive conductor not directly, electrically connected to the inductive conductor and provided on said insulation sheet at a second side, said capacitive conductor having a mirror-image pattern as said inductive conductor to form a sandwich structure around said insulation sheet, said capacitive conductor having a predetermined width providing a capacitance between said inductive conductor and said capacitive conductor.

2. An LC noise filter as defined in claim 1, wherein said insulation sheet comprises a first insulation sheet, said filter further comprising a second insulation sheet superposed on said first insulation sheet with said capacitive conductor located between the first and second insulation sheets, said second insulation sheet having a plurality of portions folded and stacked similarly at the same time when the first insulation sheet is folded.

3. An LC noise filter as defined in claim 1, wherein said inductive conductor has input/output terminals and said capacitive conductor has a grounding terminal, whereby said LC noise filter can be formed as a normal mode type filter.

4. An LC noise filter as defined in claim 1, wherein said first inductive conductor and said capacitive conductor have input/output terminals, whereby said LC noise filter can be formed as a common mode type filter.

5. An LC noise filter as defined in claim 2, wherein said inductive conductor comprises a first inductive conductor, said filter further comprising a second inductive conductor provided on said second insulation sheet at one side and disposed substantially opposite to said capacitive conductor through said second insulation sheet and wherein said capacitive conductor has a grounding terminal and said first and second inductive conductors have input/output terminals, whereby said LC noise filter can be formed as a common mode type filter.

6. An LC noise filter as defined in claim 5, further comprising a third insulation sheet superposed on said second insulation sheet with said second inductive conductor located between the second and third insulation sheets, said third insulation sheet having a plurality of portions folded and stacked similarly at the same time when the first and second insulation sheet are folded.

7. An LC noise filter as defined in claim 3 wherein each of said input/output terminals includes an external connection conductor which extends outwardly from said stack when said portions are folded and stacked.

8. An LC noise filter as defined in claim 4 wherein each of said input/output terminals includes an external connection conductor which extends outwardly from said stack when said insulation sheets are folded and stacked.

9. An LC noise filter as defined in claim 5 wherein each of said input/output terminals includes an external connection conductor which extends outwardly from said stack when said insulation sheets are folded and stacked.

10. An LC noise filter as defined in claim 1 wherein said insulation sheet is a continuous sheet including said folded portions which are connected together through folding lines.

11. An LC noise filter as defined in claim 10 wherein said folding lines are perforated.

12. An LC noise filter as defined in claim 1 wherein said stack is coated with any suitable plastic material by molding.

13. An LC noise filter as defined in claim 1 wherein said stack includes a bore formed therethrough to receive a magnetic core, said bore receiving a magnetic material for forming a magnetic path.

* * * * *